US009601480B2

(12) United States Patent
Li et al.

(10) Patent No.: US 9,601,480 B2
(45) Date of Patent: Mar. 21, 2017

(54) SINGLE JUNCTION BI-DIRECTIONAL ELECTROSTATIC DISCHARGE (ESD) PROTECTION CIRCUIT

(71) Applicant: Apple Inc., Cupertino, CA (US)

(72) Inventors: Junjun Li, San Jose, CA (US); Xin Yi Zhang, Cupertino, CA (US); Xiaofeng Fan, San Jose, CA (US)

(73) Assignee: Apple Inc., Cupertino, CA (US)

( * ) Notice: Subject to any disclaimer, the term of this patent is extended or adjusted under 35 U.S.C. 154(b) by 13 days.

(21) Appl. No.: 14/684,841

(22) Filed: Apr. 13, 2015

(65) Prior Publication Data

US 2016/0056147 A1     Feb. 25, 2016

Related U.S. Application Data

(60) Provisional application No. 62/040,129, filed on Aug. 21, 2014.

(51) Int. Cl.
*H02H 9/00*  (2006.01)
*H01L 27/02* (2006.01)
*H01L 29/78* (2006.01)

(52) U.S. Cl.
CPC ...... *H01L 27/0262* (2013.01); *H01L 27/0255* (2013.01); *H01L 29/785* (2013.01)

(58) Field of Classification Search
CPC .................................................. H01L 27/0262
USPC ........................................................ 361/56
See application file for complete search history.

(56) References Cited

U.S. PATENT DOCUMENTS

| 5,991,135 | A | * | 11/1999 | Saleh | H01L 23/60 361/111 |
|---|---|---|---|---|---|
| 6,521,952 | B1 | * | 2/2003 | Ker | H01L 27/0262 257/141 |
| 8,373,956 | B2 | * | 2/2013 | Abou-Khalil | H02H 9/046 361/118 |
| 8,405,943 | B2 | | 3/2013 | Song et al. | |
| 8,692,291 | B2 | | 4/2014 | Clark, Jr. et al. | |
| 8,760,831 | B2 | | 6/2014 | Abou-Khalil et al. | |
| 2014/0131765 | A1 | | 5/2014 | Tsai et al. | |

OTHER PUBLICATIONS

"Bidirectional Diode-Triggered Silicon-Controlled Rectifiers for Low-Voltage ESD Protection", Wen Liu et al., IEEE Electron Device Letters, vol. 33, No. 10, Oct. 2012, pp. 1360-1362.
"High-k Metal Gate-bounded Silicon Controlled Rectifier for ESD Protection", Tzu-Heng Chang et al., 2012, pp. 1-7.

* cited by examiner

*Primary Examiner* — Stephen W Jackson
(74) *Attorney, Agent, or Firm* — Meyertons, Hood, Kivlin, Kowert & Goetzel, P.C.; Lawrence J. Merkel

(57) ABSTRACT

In an embodiment, an ESD protection circuit may include a silicon-controlled rectifier (SCR) and a diode sharing a PN junction and forming a bi-directional ESD circuit. The single PN junction may reduce the capacitive load on the pin, which may allow the high speed circuit to meet its performance goals. In an embodiment, a floating P-well contact may be placed between two neighboring SCRs, to control triggering of the SCRs.

15 Claims, 6 Drawing Sheets

SINGLE JUNCTION BI-DIRECTIONAL ELECTROSTATIC DISCHARGE (ESD) PROTECTION CIRCUIT

This application claims benefit of priority to U.S. Provisional Patent application Ser. No. 62/040,129, filed on Aug. 21, 2014. The above application is incorporated herein by reference in its entirety. To the extent that any incorporated material conflicts with the material expressly set forth herein, the expressly set forth material controls.

BACKGROUND

Technical Field

Embodiments described herein are related to electrostatic discharge (ESD) protection in integrated circuits.

Description of the Related Art

The transistors and other circuits fabricated in semiconductor substrates are continually being reduced in size as semiconductor fabrication technology advances. Such circuits are also increasingly susceptible to damage from ESD events, thus increasing the importance of the ESD protection implemented in integrated circuits. Generally, ESD events occur due to the accumulation of static charge, either on the integrated circuits themselves or on devices or other things that come into contact with the integrated circuits. Entities such as humans can also accumulate static charge and cause ESD events when coming into contact with an integrated circuit or its package.

A sudden discharge of the static charge can cause high currents and voltages that can damage the integrated circuit, and the potential for damage is higher with smaller feature sizes. There are various models for ESD events, which integrated circuit designers use to design and evaluate ESD protection circuits. For example, the charged device model (CDM) models the discharge of static electricity accumulated on the integrated circuit itself. The human body model (HBM) models the discharge of static electricity from a human body touch on the integrated circuit. Other models may be used for other types of ESD (e.g. the contact of various machines during manufacturing, etc.).

Typical ESD protection circuits for integrated circuits include diodes that are connected between integrated circuit input/output signal pin connections and power/ground connections. The diodes and other protection circuits are designed to turn on if an ESD event occurs, rapidly discharging the ESD event to avoid damage to the functional circuits (e.g. driver/receiver transistors) that are coupled to the pin connections. The ESD circuits are designed to withstand the maximum currents/voltages of various ESD events, according to a specification to which the integrated circuit is designed.

When a load-sensitive circuit (e.g. a high speed analog circuit) is integrated into a larger integrated circuit, the size of the ESD devices presents significant design challenges. The large ESD devices load the pins, reducing performance of the high speed circuit. The large ESD devices also consume significant area.

SUMMARY

In an embodiment, an ESD protection circuit may include a silicon-controlled rectifier (SCR) and a diode sharing a PN junction and forming a bi-directional ESD circuit. The single PN junction may reduce the capacitive load on the pin, which may allow the high speed circuit to meet its performance goals. In an embodiment, a floating P-well contact may be placed between two neighboring SCRs, to control triggering of the SCRs.

BRIEF DESCRIPTION OF THE DRAWINGS

The following detailed description makes reference to the accompanying drawings, which are now briefly described.

Figure 1:
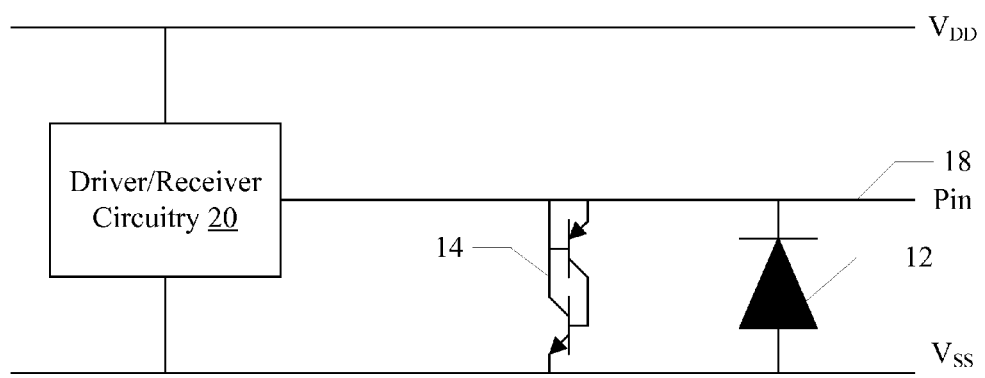
FIG. 1 is a circuit diagram of one embodiment of an ESD protection circuit for driver/receiver circuitry.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

FIG. 1 is a circuit diagram illustrating one embodiment of an ESD protection circuit that includes a diode 12 and a silicon controlled rectifier (SCR) 14 to protect driver/receiver circuitry 20. The circuits 12, 14, and 20 are coupled to a conductor (wire) 18 that makes connection to a pin on a package containing the circuit of FIG. 1. A pin may generally be any external connection point (e.g. a solder ball for packages such as ball grid array, an electrical lead to connect to a through hole on a circuit board, a "leadless" lead to connect to a solder connection on a board, etc.). The pin is an external conductor, and thus may be subject to an ESD event. ESD events may include high voltages and/or currents that would otherwise damage transistors in the driver/receiver circuit 20. The circuits 12, 14, and 20 are coupled to the $V_{SS}$ (ground) rail, and the driver/receiver circuit 20 is further coupled to the $V_{DD}$ (power supply) rail. The diode 12 may be configured to conduct current to handle an ESD event from the ground ($V_{SS}$) rail to the pin (reverse-bias). The SCR 14 may be configured conduct current to handle an ESD event to the $V_{SS}$ rail from the pin in response to a trigger (forward-bias). Accordingly, the ESD protection circuit may be bi-directional and no connection to the $V_{DD}$ rail may be needed.

In one embodiment, the diode 12 and the SCR 14 may share a single junction, and thus may reduce the capacitive load on the pin as compared to dual-diode structures and other ESD structures. For pins that are highly sensitive to capacitance, the ESD protection circuit described herein may provide a lighter load and thus a lower impact on the functional communication on the pin. Examples of pins that are highly sensitive to capacitance may include various high speed input/output (I/O) interfaces such as Peripheral Component Interconnect Express (PCIe), universal serial bus (USB), etc. The diode 12 and the SCR 14 may be formed using the structure illustrated in FIGS. 4-6, in one embodiment.

The driver/receiver circuitry 20 may include any circuitry to drive and/or receive signals on the pin to which the conductor 18 is connected. If the pin is an output, the circuitry 20 may include driving transistors having source or drain connections to the conductor 18. If the pin is an input, the circuitry 20 may include receiving transistors having gate connections to the conductor 18. If the pin is an input/output pin, the circuitry 20 may include both driving and receiving transistors. The driver/receiver circuitry 20 may include additional ESD protection circuitry (e.g. a voltage clamp circuit).

Figure 2:
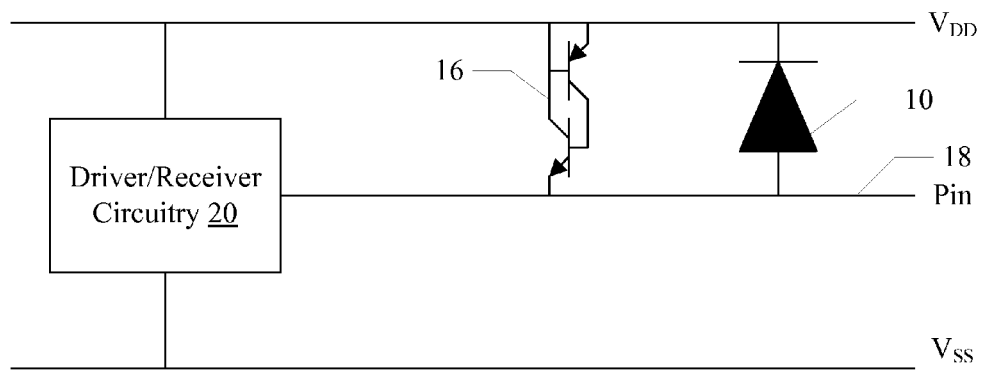
FIG. 2 is a circuit diagram of another embodiment of an ESD protection circuit for driver/receiver circuitry.

FIG. 2 is a circuit diagram illustrating another embodiment of an ESD protection circuit that includes a diode 10 and an SCR 16 to protect the driver/receiver circuitry 20. The circuits 10, 16, and 20 are coupled to the conductor (wire) 18 that makes connection to a pin on a package containing the circuit of FIG. 2. The circuits 10, 16, and 20 are coupled to the $V_{DD}$ rail, and the driver/receiver circuit 20 is further coupled to the $V_{SS}$ rail. Similar to the diode 12 and the SCR 14 in FIG. 1, the diode 10 may be configured to conduct current to handle an ESD event to the $V_{DD}$ rail from the pin and the SCR 16 may be configured to conduct current to handle an ESD event to the pin from the $V_{DD}$ rail. Accordingly, the ESD protection circuit may be bi-directional and no connection to the $V_{SS}$ rail may be needed. Similar to the discussion above, the embodiment of FIG. 2 may be a low capacitance solution for the pins that are sensitive to capacitance.

It is noted that the embodiment of FIG. 2 may be used in a "triple well" process in which an isolated P-well is available in the semiconductor substrate. It is further noted that, if desired, both of the ESD circuits shown in FIG. 1 and FIG. 2 may be used in some embodiments. The $V_{DD}$ and $V_{SS}$ rails may be examples of voltage rails. Generally, a voltage rail may refer to interconnect provided in an integrated circuit to be connected to a particular voltage level (e.g. $V_{DD}$ and $V_{SS}$, or power and ground, respectively). For many integrated circuits, multiple pins on a package may be coupled to the power rail and multiple pins may be coupled to a ground rail, to help stabilize the voltages in the presence of (possibly large) current flows.

Figure 3:
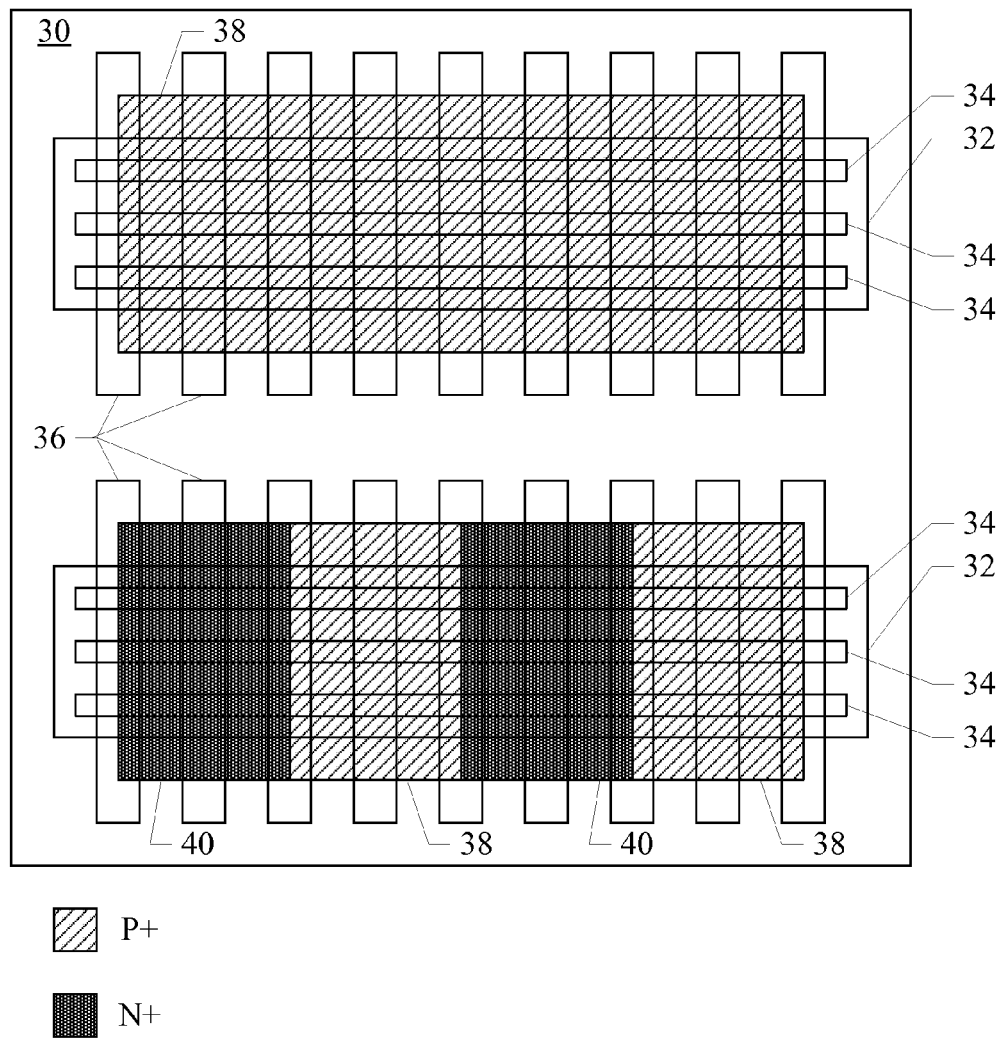
FIG. 3 is a block diagram of one embodiment of a top view of a semiconductor substrate employing a fin field effect transistor (FinFET) technology.

FIG. 3 is a top view of one embodiment of a semiconductor substrate. In the illustrated embodiment, the substrate may be P-type (P). The substrate may include an N-type (N) well 30 formed in the P-type substrate. Other embodiments may have an N-type substrate and may use a P-well, or a dual-well semiconductor fabrication process may be used. More particularly, in one embodiment, N-wells may be formed and the remainder of the substrate may be P-well (or vice versa). Semiconductor regions 32 may be formed within the N-well 30. In one embodiment, the semiconductor material is silicon. The semiconductor regions 32 may be insulated from each other using any fabrication technique (e.g. shallow trench isolation (STI)). The semiconductor regions 32 may include multiple "fins" 34 in a FinFET semiconductor fabrication technology. That is, the fins 34 in the semiconductor regions 32 may rise above the surface of the substrate as compared to the well 30, for example. The fins 34 in each region 32 may be parallel to each other and parallel to the fins 34 in other regions 32.

The fins 34 may be doped with impurities to produce highly doped N-type and P-type conduction regions (denoted as N+ and P+). A highly-doped region may include a greater density of the impurities than the normally doped regions/wells (e.g. P-wells, N-wells, and semiconductor substrate regions). For example, highly-doped regions may include one or more orders of magnitude greater density of impurities than the normally doped regions. In the illustrated embodiment, cross-hatched areas 38 may represent P+ regions and dot-filled areas 40 may represent N+ regions. The areas 38 and 40 may be the areas over which the dopants may be implanted. The fins 34 may actually be separated by insulators such as STI, and so the actual N+ and P+ regions may be in the fins 34 themselves. The N+ and P+ regions may be constructed in areas of the substrate in which diodes and SCRs are to be formed (e.g. to form ESD protection circuits). Depending on the FinFET fabrication process, the fins may be further grown into other shapes such as diamond or merged together through a semiconductor epitaxial process step.

Each semiconductor region 32 may have polysilicon "fingers" built thereon. For example, fingers 36 are illustrated in FIG. 3. The fingers may form gates for transistors formed in the fins 34 in areas where transistors are fabricated, for example. The P-well sections of the semiconductor substrate may similarly include semiconductor regions 32 having fins 34, fingers 36, and N+ and P+ areas 38 and 40.

The border between each P+ and N+ area forms a P-N junction (more briefly PN junction) that may operate as a diode or may be used as one of the PN junctions of an SCR. Additionally, borders between P-wells and N-wells form PN junctions that may form diodes or SCR junctions. Similarly, borders between P+ areas and N-wells, and borders between N+ areas and P-wells, may form PN junctions. There may be gate-bound diodes/SCRs formed across a region 32 (e.g. the region 32 on the bottom of FIG. 3, in which multiple P+ and N+ areas are formed within the region). Additionally, STI-bound diodes/SCRs may be formed between regions 32, where one of the regions 32 is within the N-well 30 and the other region 32 is in a P-well (e.g. the P-well outside the N-well 30)

It is noted that, in other embodiments, adjacent regions 32 may be entirely of the opposite conduction type (e.g. the P+ area on the top region 32 may be adjacent to another region 32 that is entirely N+). Alternatively, adjacent regions may have the same conduction type. Any combination of various P+ and N+ areas in adjacent regions may be used.

Figure 4:
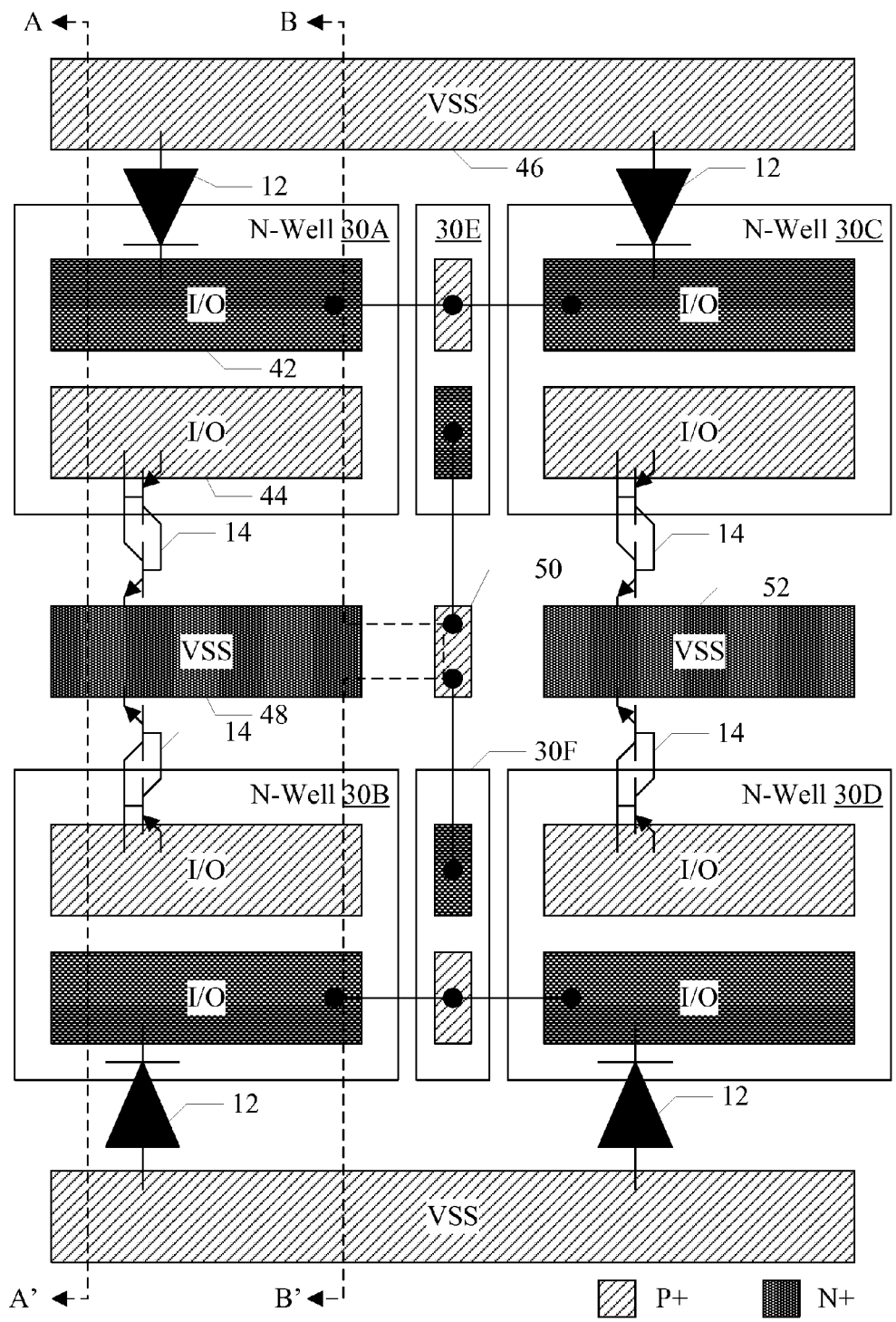
FIG. 4 is a block diagram of one embodiment of a simplified top view of ESD protection circuits of FIG. 1 on a semiconductor substrate.

FIG. 4 is a block diagram of one embodiment of a top view of ESD protection circuits of FIG. 1 on a semiconductor substrate. FIG. 4 may be a simplified view. Regions 32 that include N+ or P+ areas, including fingers 36 and fins 34, are illustrated as blocks of conduction type (N+ or P+). Each area should be viewed as a region 32 similar to that shown in FIG. 3, in an embodiment (or multiple adjacent regions 32). Various N-wells 30A-30F are shown in FIG. 4. Areas outside of the N-wells 30A-30F may be P-well in this embodiment of the FinFET technology. P-wells are not shown in FIG. 4, but are illustrated in the cross-sections of FIGS. 5 and 6.

N-wells 30A-30D each include N+ and P+ regions that form transistors for I/O driver/receiver circuits similar to the circuits 20 shown in FIG. 1 or 2. The embodiment of FIG. 4 may implement SCRs 14 and diodes 12 similar to the embodiment of FIG. 1. Thus, for example, N-well 30A includes N+ region 42 and P+ region 44 to form N and P transistors for the I/O driver receiver circuit 20. A P+ region 46 that is coupled to the $V_{SS}$ rail is provided, as well as an N+ region 48 that is coupled to the $V_{SS}$ rail. The discussion below will focus on the diode 12 and the SCR 14 formed between the N-Well 30A regions 42 and 44 and the $V_{SS}$ regions 46 and 48. A similar discussion may apply to the N-Wells 30B-30D and the surrounding $V_{SS}$ regions.

The P-Well that includes the P+ $V_{SS}$ region 46 and the N-Well 30A may form a PN junction that may be used as an STI-bound diode 12. The P+ region 44 to the N-well 30A to the P-Well in which the N+ region 48 is formed and finally to the N+ region 48 itself may be PNPN junctions forming the SCR 14. Again, the SCR 14 may be an STI-bound SCR in this embodiment.

The N-well 30A junction to the surrounding P-well may be a single junction that is shared by the diode 12 and the SCR 14 (particularly the cathode of the diode 12 and the anode of the SCR 14), and thus the capacitive load presented by the ESD protection circuit may be low compared to other ESD protection circuits such as dual-diode circuits.

A P+ region 50 in FIG. 4 may be used as a trigger contact for the SCRs 14. The contact may be a floating contact, and may be provided for any type of triggering circuit. For example, a resistance-capacitance (RC) trigger circuit or a diode trigger circuit may be used. The P+ region 50 may be isolated from other P+ regions such as the P+regions coupled to $V_{SS}$ (e.g. the P+ region 46). More particularly, the floating P contact may be shared by SCRs that have their cathodes in the adjacent N+ regions 48 and 52.

Figure 5:
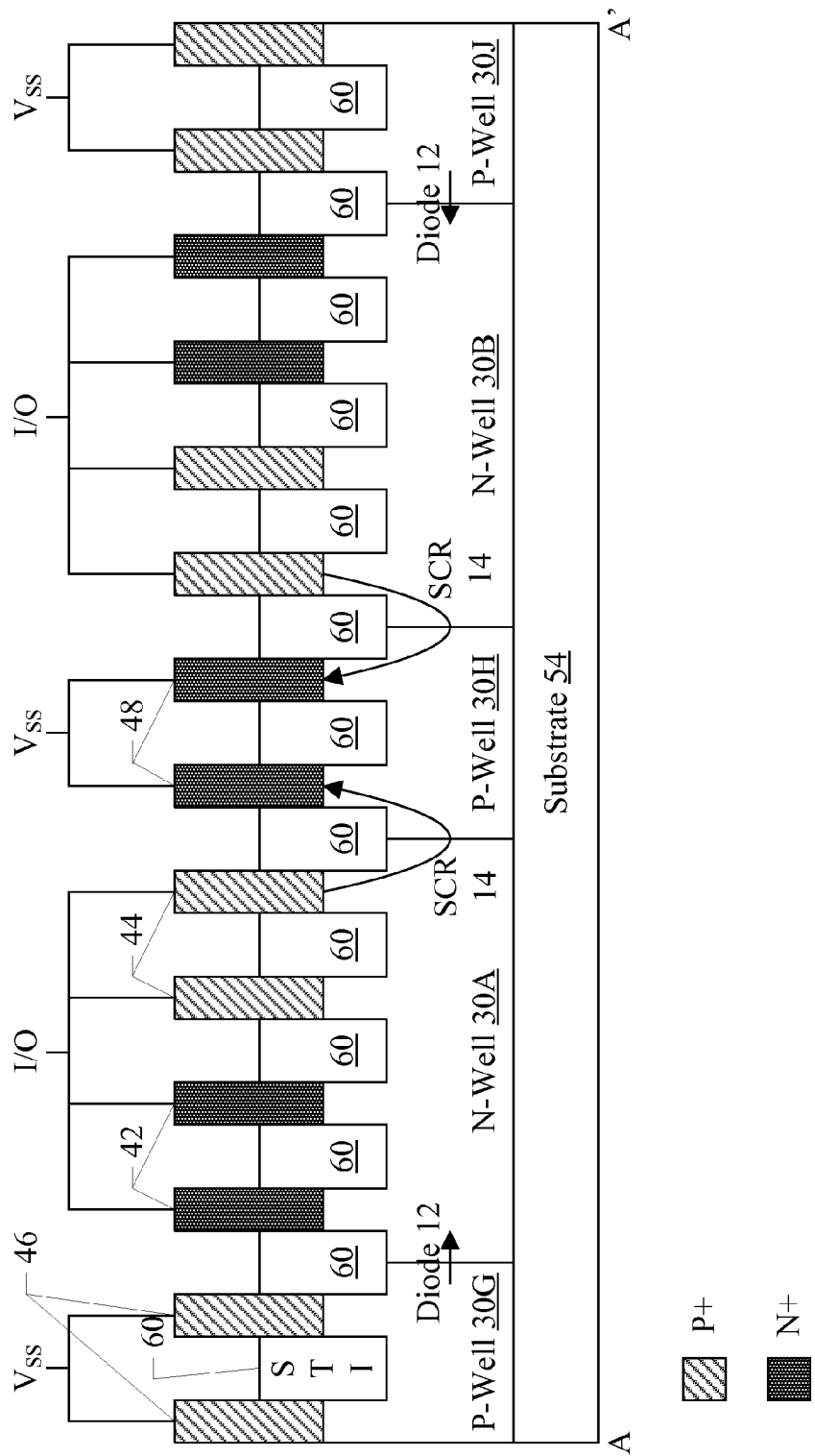
FIG. 5 is a block diagram of one embodiment of a cross section of the semiconductor substrate along a line A-A' in FIG. 4.
Figure 6:
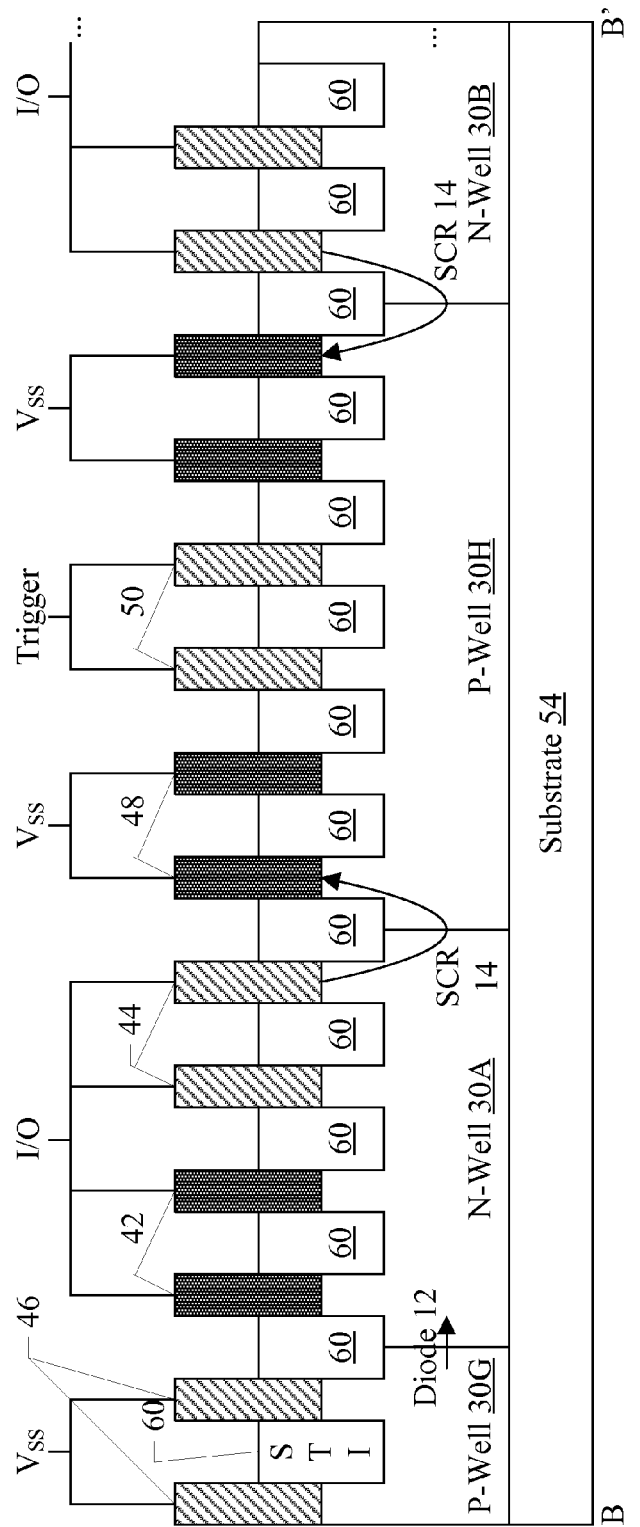
FIG. 6 is a block diagram of one embodiment of a cross section of the semiconductor substrate along a line B-B' in FIG. 4.

Lines A-A' and B-B' are illustrated in FIG. 4, and correspond to the cross sections of FIGS. 5 and 6, respectively. The line B-B' includes the P+ region 50 (and thus can be seen in FIG. 4 to move to the right and then back to the left near the P+ region 50 in FIG. 4).

The N-wells 30E and 30F may include P+ regions for contacts for the driving and/or received signals for the driver/receiver circuits 20, as well as N+ regions coupled to the P+ region 50. The N+ region in the N-wells 30E and 30F may form trigger diodes with the P+ region 50 for the SCRs 14, for embodiments that use trigger diodes to detect ESD events and triggering the SCRs 14. Other embodiments that use other trigger circuits need not include the connections to the N+ regions in the N-wells 30E-30F and may not include the N+ regions in the N-wells 30E-30F either.

FIG. 5 is a cross section taken along the line A-A' in FIG. 4. A semiconductor substrate 54 is shown, into which the N-wells 30A and 30B are implanted. P-wells 30G, 30H, and 30J are also illustrated in FIG. 5. P-wells 30G, 30H, and 30J may be part of an overall P-well that may be provided in the substrate 54 at places that are not N-wells in the substrate 54. The N+ and P+ regions 42, 44, 46, and 48 are shown with various fins in the regions. The fins are separated by STI structures 60 in each region 42, 44, 46, and 48. Thus, the actually highly-doped areas may be the areas under and in the fins. Additionally, STI structures 60 separate the regions 42, 44, 46, and 48, as discussed above. The STI structures 60 between regions may be wider than the STI structures 60 within a region in an embodiment. Additionally, depths of the STI structures 60 between regions may differ from the STI structures 60 within a region. While two fins are shown in a given region, in part due to the available space in the drawing, various embodiments may employ any desired number of fins.

The diodes 12 are illustrated across the P-well 30G to N-well 30A boundary and the P-well 30J to N-well 30B boundary. The anodes of the diodes 12 are in the P-wells 30G and 30J and the cathodes of the diodes 12 are in the N-wells 30A and 30B. The SCRs 14 are illustrated from the P+ region 44 to the N-well 30A to the P-well 30H to the N+ region 48, and similarly from the P+ region in the N-well 30B to the N-well 30B to the P-well 30H to the N+ region 48. The anodes of the SCRs 14 are in the N-wells 30A and 30B, and the cathodes of the SCRs 14 are in the P-well 30H. It is noted that, while the arrows illustrating the SCRs 14 extend from one fin of each region to the fin of the adjoining region, each fin of the region may contribute to the SCR 16.

FIG. 6 is a cross section taken along the line B-B' in FIG. 4. A portion of the cross section is not shown in FIG. 6 (removed part illustrated by the ellipses shown in FIG. 6) for space reasons. The removed part may be similar to the cross section illustrated in FIG. 5. The semiconductor substrate 54 is shown, into which the N-wells 30A and 30B are implanted. P-wells 30G and 30H are also illustrated in FIG. 6. The N+ and P+ regions 42, 44, 46, and 48 are shown in various fins in the regions, separated by STI structures 60 in each region 42, 44, 46, and 48. Furthermore, the P+ region 50 is shown with the trigger input coupled thereto. The P+ region 50 to the P-well 30H is not a junction, so the trigger is coupled to the junction between the N-Well 30A and the P-well 30H within the SCR 14 on the left in FIG. 6. The trigger input is also coupled to the junction between the P-well 30H and the N-well 30B to provide the trigger within the SCR 14 on the right in FIG. 6. Thus, the trigger is shared by the two SCRs 14 in FIG. 6. The trigger may further be shared by the SCRs 14 extending from the N-wells 30C and 30D in FIG. 4. The trigger input may be next to the SCR cathode but may not interfere with the SCR current path in this embodiment. The floating P-well contact for the trigger input may be isolated from the anode of the diodes 12 in the P+ $V_{SS}$ region 46.

Figure 7:
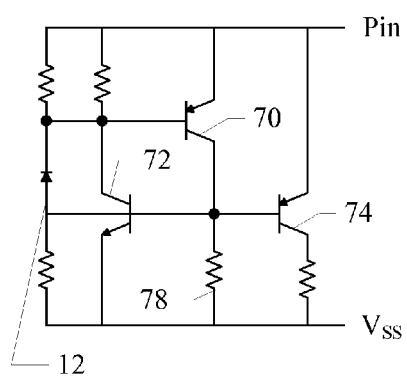
FIG. 7 is a circuit diagram illustrating one embodiment of the ESD protection circuit of FIG. 1 in greater detail.

FIG. 7 is a circuit diagram illustrating the SCR 14 and the diode 12 for one embodiment. The SCR 14 in FIG. 7 may include the transistors 70 and 72. Another transistor 74 may form a triggering diode for the SCR 14, for embodiments that employ the trigger diode. Various resistances are illustrated in FIG. 7 as well. In particular, the resistor 78 may be a resistance through the substrate 54. As discussed previously, the SCR 14 formed from the transistors 70 and 72 may be the main positive ESD discharge path, while the diode 12 and the two resistors in series with it may be the main negative ESD discharge path. To carry the potentially large ESD current, the resistors in series with the diode 12 may be made as small as possible. During a positive ESD event, the trigger diode 74 may inject current into the base of transistor 72, and its base resistor 78. The transistor 72 may thus be biased at its base by the voltage drop across resistor 78 into the forward active mode, triggering the SCR current path through transistors 70 and 72.

Figure 8:
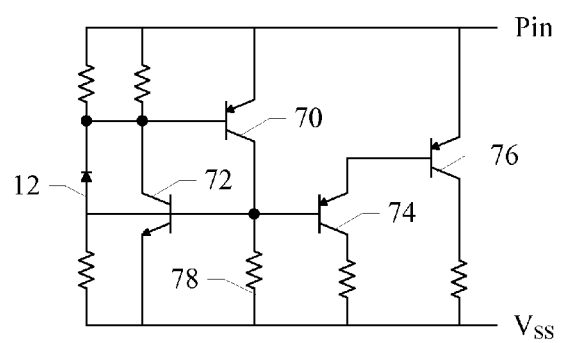
FIG. 8 is a circuit diagram illustrating another embodiment of the ESD protection circuit of FIG. 1 in greater detail.

FIG. 8 is another embodiment, including a second trigger diode 76. The embodiment of FIG. 8 may be used, for example, if the leakage current through the diode 74 is of concern during normal operating conditions. The leakage current through the trigger diode(s) 74 and 76 may be significantly reduced. The triggering mechanism may remain the same with one or multiple trigger diodes in various embodiments.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a conductor coupled to a pin on a package of the integrated circuit;
   a voltage rail; and
   an electrostatic discharge (ESD) protection circuit coupled between the conductor and the voltage rail wherein the ESD protection circuit comprises:
     a diode having a first anode coupled to the voltage rail and a first cathode coupled to the pin; and
     a silicon-controlled rectifier (SCR) having a second cathode coupled to the voltage rail and a second anode coupled to the pin, wherein the second anode and the first cathode share a PN junction in a semiconductor substrate on which the integrated circuit is fabricated.

2. The integrated circuit as recited in claim 1 wherein the diode is configured to conduct current in response to a first ESD event from the voltage rail to the pin.

3. The integrated circuit as recited in claim 1 wherein the SCR is configured to conduct current in response to a second ESD event from the pin to the voltage rail.

4. The integrated circuit as recited in claim 3 wherein the voltage rail is a ground voltage rail.

5. The integrated circuit as recited in claim 1 wherein the second cathode is coupled to a floating P-well contact for triggering.

6. The integrated circuit as recited in claim 5 further comprising another SCR for another pin, wherein the other SCR is coupled to the floating P-well contact.

7. The integrated circuit as recited in claim 6 further comprising a trigger diode coupled to the floating P-well contact, wherein the trigger diode is configured to trigger the SCR and the other SCR in response an ESD event.

8. The integrated circuit as recited in claim 5 wherein the floating P-well contact does not interfere with a current path of the SCR.

9. An electrostatic discharge (ESD) protection circuit comprising:
   a reverse-biased diode configured to handle a first ESD event between a voltage rail and a pin in an integrated circuit; and
   a forward-biased silicon-controlled rectifier (SCR) configured to handle a second ESD event between the voltage rail and the pin, wherein a first direction of current flow in the first ESD event is opposite a second direction of current flow in the second ESD event, wherein a first node of the reverse-biased diode and a second node of the forward-biased SCR share a PN junction in a semiconductor substrate on which the ESD protection circuit is formed.

10. The ESD protection circuit as recited in claim 9 further comprising a floating P-well contact coupled to a third node of the forward-biased SCR.

11. The ESD protection circuit as recited in claim 9 wherein the voltage rail is a ground voltage rail.

12. The ESD protection circuit as recited in claim 11 wherein the first node is a cathode and the second node is an anode.

13. A method comprising:
   triggering a diode in response to a first electrostatic discharge (ESD) event from a voltage rail to a pin on an integrated circuit package, wherein the diode has a first anode coupled to the voltage rail and a first cathode coupled to the pin; and
   triggering a silicon-controlled rectifier (SCR) in response to a second ESD event from the pin to the voltage rail, wherein the SCR has a second cathode coupled to the voltage rail and a second anode coupled to the pin, wherein the voltage rail is a ground voltage rail and wherein the second anode and the first cathode share a PN junction in a semiconductor substrate on which the integrated circuit is fabricated.

14. The method as recited in claim 13 wherein the second cathode is coupled to a floating P-well contact, and wherein the integrated circuit further comprises a trigger diode coupled to the floating P-well contact, wherein triggering the SCR is performed by the trigger diode in response to the second ESD event.

15. The method as recited in claim 13 further comprising:
   reverse-biasing the diode; and
   forward-biasing the SCR.

* * * * *